(12) United States Patent
Park

(10) Patent No.: US 7,923,768 B2
(45) Date of Patent: Apr. 12, 2011

(54) SEMICONDUCTOR DEVICE WITH NON-VOLATILE MEMORY FUNCTION AND METHOD OF MANUFACTURING THE SAME

(75) Inventor: Sung Kun Park, Cheongju-si (KR)

(73) Assignee: Dongbu HiTek, Co., Ltd., Seoul (KR)

( * ) Notice: Subject to any disclaimer, the term of this patent is extended or adjusted under 35 U.S.C. 154(b) by 45 days.

(21) Appl. No.: 11/981,218

(22) Filed: Oct. 30, 2007

(65) Prior Publication Data

US 2008/0128775 A1 Jun. 5, 2008

(30) Foreign Application Priority Data

Nov. 30, 2006 (KR) .......................... 10-2006-0119771

(51) Int. Cl.
*H01L 29/788* (2006.01)
(52) U.S. Cl. .................. 257/316; 257/E21.422; 438/259
(58) Field of Classification Search .................. 257/213, 257/288, 314–366, 21.422 E; 438/137, 138, 438/156, 173, 192, 209, 212, 268, 257–259
See application file for complete search history.

(56) References Cited

U.S. PATENT DOCUMENTS

| | | | | |
|---|---|---|---|---|
| 5,558,313 A * | 9/1996 | Hshieh et al. | .................. | 257/342 |
| 6,083,793 A * | 7/2000 | Wu | .................. | 438/270 |
| 6,087,222 A | 7/2000 | Lin et al. | | |
| 6,127,226 A * | 10/2000 | Lin et al. | ......................... | 438/259 |
| 6,583,466 B2 * | 6/2003 | Lin et al. | ......................... | 257/314 |
| 6,747,310 B2 * | 6/2004 | Fan et al. | ....................... | 257/320 |
| 7,038,267 B2 * | 5/2006 | Chang et al. | ................... | 257/315 |
| 7,199,427 B2 * | 4/2007 | Blanchard | ...................... | 257/335 |
| 7,504,690 B2 * | 3/2009 | Kelly et al. | .................... | 257/328 |
| 7,537,996 B2 * | 5/2009 | Hu et al. | ........................ | 438/266 |
| 7,585,724 B2 * | 9/2009 | Chung-Zen | ................... | 438/257 |
| 7,592,224 B2 * | 9/2009 | Swift et al. | ..................... | 438/259 |
| 2002/0155664 A1 * | 10/2002 | Noro | .............................. | 438/263 |
| 2005/0012137 A1 | 1/2005 | Levi et al. | | |
| 2005/0169041 A1 * | 8/2005 | Wang | ............................. | 365/154 |

FOREIGN PATENT DOCUMENTS

KR    1999-029125    4/1999

(Continued)

OTHER PUBLICATIONS

Onakado Takahiro and Ajika Natsuo; "Memory Cell and Non-Volatile Semiconductor Memory Device Having the Same": Publication Patent Gazette; Publication No. 10-1999-0029125; Publication Date: Apr. 26, 1999; Korean Intellectual Property Office, Republic of Korea.

(Continued)

*Primary Examiner* — Matthew W Such
*Assistant Examiner* — Ali Naraghi
(74) *Attorney, Agent, or Firm* — The Law Office of Andrew D. Fortney; Andrew D. Frotney

(57) ABSTRACT

Disclosed are a semiconductor device and a method of manufacturing the same. The semiconductor device includes a semiconductor substrate having source and drain areas; a floating gate between the source and drain areas having a programmed or erased state, thereby controlling a current flow between the source and drain areas; and a tunneling gate adapted to program or erase the floating gate depending on voltage(s) applied to the source, drain and/or tunneling gate.

19 Claims, 10 Drawing Sheets

FOREIGN PATENT DOCUMENTS

| KR | 10-2005-0010243 | 1/2005 |
|---|---|---|
| KR | 10-2006-0081948 | 7/2006 |

OTHER PUBLICATIONS

Korean Office Action dated Apr. 18, 2008; Korean Patent Application No. 10-2006-0119771; Korean Intellectual Property Office, Republic of Korea.

Gwang Whan Cho; Apparatus and a Method for Tuning a Specific Channel of a TV, Concerned with Watching the Specific Channel by Means of a Password; Publication No. 1020060081948 A; Publication Date Jul. 14, 2006; Korean Patent Abstract; Korean Intellectual Property Office, Republic of Korea.

Heung Jae Cho, Se Aug Jang, Yong Soo Kim, Kwan Yong Lim and Hong Seon Yang; Method of Fabricating Flash Memory Device to Form Dielectric Layer of ONO Structure and Improve Step Coverage Characterisitc; Korean Patent Abstracts; Publication No. 1020050010243 A; Published Jan. 27, 2005; Korean Intellectual Property Office, Korea.

English Translation of partial Office Action dated Apr. 28, 2009; German Patent Application No. 102007056590.0; German Patent and Trade Mark Office; Republic of Germany.

Partial Chinese Office Action date stamped Oct. 23, 2009; Chinese Patent Application No. 2007101960446; 1 Page; The State Intellectual Porperty Office of P.R.C., People's Republic of China.

* cited by examiner

SEMICONDUCTOR DEVICE WITH NON-VOLATILE MEMORY FUNCTION AND METHOD OF MANUFACTURING THE SAME

The present application claims priority under 35 U.S.C. 119 and 35 U.S.C. 365 to Korean Patent Application No. 10-2006-0119771 (filed on Nov. 30, 2006), which is hereby incorporated herein by reference in its entirety.

BACKGROUND

Embodiments of the invention relate to a semiconductor device and a method of manufacturing the same.

FIG. 1 is a perspective view of a power transistor.

Referring to FIG. 1, a first conductive drain area (N+ junction) 11, a first conductive epitaxial layer (N-epi) 12 formed on the drain area 11 and a second conductive silicon layer (P-sub) 13 formed on the epitaxial layer 12 are formed in a semiconductor substrate 10. Here, the first and second conductive types may respectively mean N-type and P-type, or vice versa.

A transistor having a vertical structure is formed on the semiconductor substrate 10. To this end, a plurality of trenches are formed by removing the drain area 11 and a portion of the epitaxial layer 12 in the semiconductor substrate 10. A plurality of gate electrodes 15, each having an oxide layer 14 and a polysilicon gate (the hatched part of electrode 15), are formed in the plurality of trenches.

Source areas 16 doped with first conductive impurity ions are formed in the second conductive silicon layer 13 at opposed sides of each gate electrode 15.

Since power loss of such a power transistor must be reduced, it is important to reduce on-state resistance. An epitaxial wafer (epiwafer) is used to lower the on-state resistance, and a transistor having a vertical structure is formed. Further, a plurality of gate electrodes 15 are formed, and the length of the gate electrode 15 is sufficiently long to reduce the resistance sufficiently.

Meanwhile, the transistor is maintained in an off state. When a positive (+) voltage is applied to the gate electrode 15, a channel is formed in a vertical direction in the silicon layer 13 (P-sub) between the source and drain areas 16 and 11. Thus, a current flows through the channel in the vertical direction. That is, in the transistor, a positive (+) voltage must be always applied to the gate electrode 15 such that an on state is maintained.

Accordingly, embodiments of the invention relate to a semiconductor device (e.g., a power transistor), in which a power control state can be stored, and power can be applied in accordance with the power control state.

In addition, embodiments of the invention provide a semiconductor device used as a switch for power control, in which a power control state can be stored without applying additional control power.

According to an aspect of the embodiment, there is provided a semiconductor device, which includes a semiconductor substrate having source and drain areas; a floating gate between the source and drain areas which may have a programmed or erased state, thereby controlling a current flow between the source and drain areas in accordance with the state of the floating gate; and a tunneling gate adapted to program and/or erase the floating gate.

According to another aspect of the invention, there is provided a semiconductor device, which includes a semiconductor substrate having a first conductive type drain area, a second conductive type silicon layer thereon and a first conductive type source area thereon (e.g., in a vertical direction); floating gates formed in a plurality of trenches in the source area and the silicon layer; an insulating layer on an outer surface of the floating gate; a tunneling gate on the floating gates; and sidewalls on opposite sides of the floating gate.

According to still another aspect of the invention, there is provided a method of manufacturing a semiconductor device, which includes the steps of forming a floating gate having a portion in a semiconductor substrate; forming an oxide layer on an entire surface of the semiconductor substrate; forming a tunneling gate on the floating gate; and implanting first conductive impurity ions into the semiconductor substrate, thereby forming a source area, and forming a drain area beneath the semiconductor substrate.

DETAILED DESCRIPTION OF THE EMBODIMENTS

Figure 1:
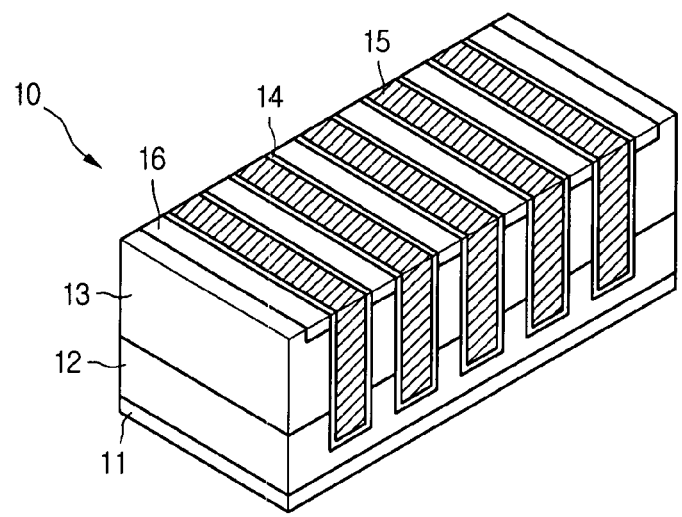
FIG. 1 is a perspective view of a power transistor.

Hereinafter, a semiconductor device and a method of manufacturing the same according to exemplary embodiments will be described in detail with respect to the accompanying drawings.

Since the semiconductor device according to one embodiment of the invention has a non-volatile memory function on board (e.g., one or more bits of non-volatile memory), a current flow can be controlled in accordance with stored power control state, without supplying power to the control terminal(s) of the power device.

The semiconductor device according to one embodiment includes a first conductive type drain area 37, a first conductive type epitaxial layer (N-epi) 21 on the drain area 37, a second conductive type silicon layer (P-sub) 22 on the epitaxial layer 21, and a first conductive type source area 36 on the silicon layer 22. The first conductive type epitaxial layer 21 is not required to be an epitaxial layer; opposite surfaces of a first conductive type single-crystal silicon substrate can be doped with first and second conductive type impurity ions to form a similar structure.

Trenches or holes are formed in the source area 36, the silicon layer 22 and the epitaxial layer 21, then floating gates 28 comprising a conductive material are formed therein. The floating gate 28 comprises a conductive material, such as polysilicon or tungsten (W), and an oxide layer 27 that serves as an insulating layer essentially surrounds an outer surface of the floating gate 28. One portion of the floating gate 28 is in the semiconductor substrate (e.g., in the trenches or holes), and the other portion of the floating gate 28 protrudes from the upper surface of the substrate (i.e., above the source areas 36).

If the floating gate 28 is programmed, a current flow may be formed in the vertical channel between the source and drain areas 36 and 37. Thus, the floating gate 28 serves in a power switch device. In other words, the floating gate 28 is not controlled directly by an externally generated gate voltage, but rather, by forming a channel depending on a programmed/ erased state of the floating gate 28 (e.g., by the value of a bit stored in accordance with characteristics of a non-volatile memory device).

A tunneling gate 32 and a control gate 33 are formed on the floating gates 28, and electrons flow into or out from the floating gates 28 depending on a voltage applied to the tunneling gate 32 and the control gate 33 (and, optionally, a voltage applied to the source 36 and/or drain 37). That is, the semiconductor device according to the embodiment serves as a non-volatile memory and a power switch.

Hereinafter, the semiconductor device and method(s) of making the same according to various embodiments will be described in detail.

FIGS. 2 to 16 are views illustrating a semiconductor device and a method of manufacturing the same according to one embodiment.

Figure 2:
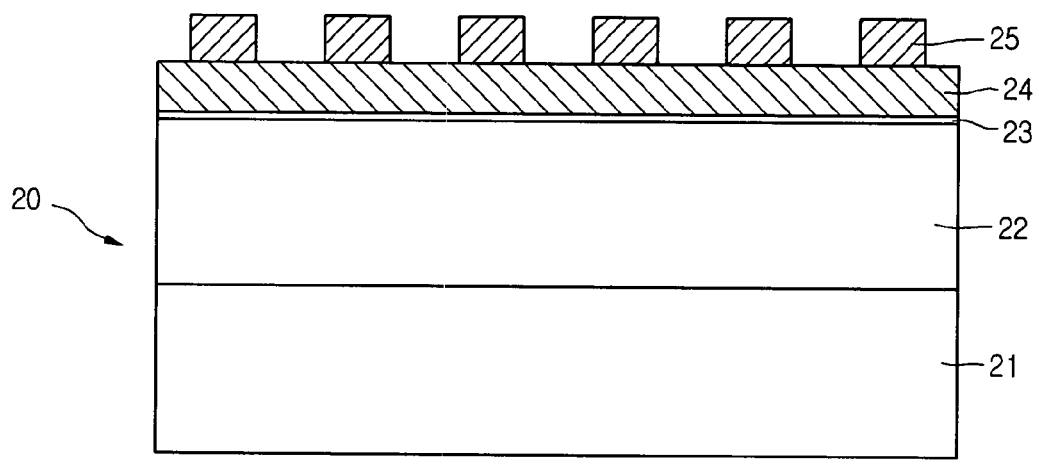
FIGS. 2 to 16 are views illustrating a semiconductor device and a method of manufacturing the same according to an embodiment of the invention.

Referring to FIG. 2, a first oxide layer 23 (e.g., silicon dioxide) and a nitride layer 24 (e.g., silicon nitride) are sequentially formed on a semiconductor substrate 20 having a first conductive epitaxial layer (N-epi) 21 and a second conductive silicon layer (P-sub) 22. For example, the oxide layer 23 may be formed by thermal oxidation of the second conductive silicon layer 22, and the nitride layer 24 may be formed by chemical vapor deposition (CVD), which may be plasma enhanced (PECVD) or low pressure (LPCVD). A photoresist is coated on the nitride layer 24 and patterned by photolithography, thereby forming a first photoresist pattern 25.

Figure 3:
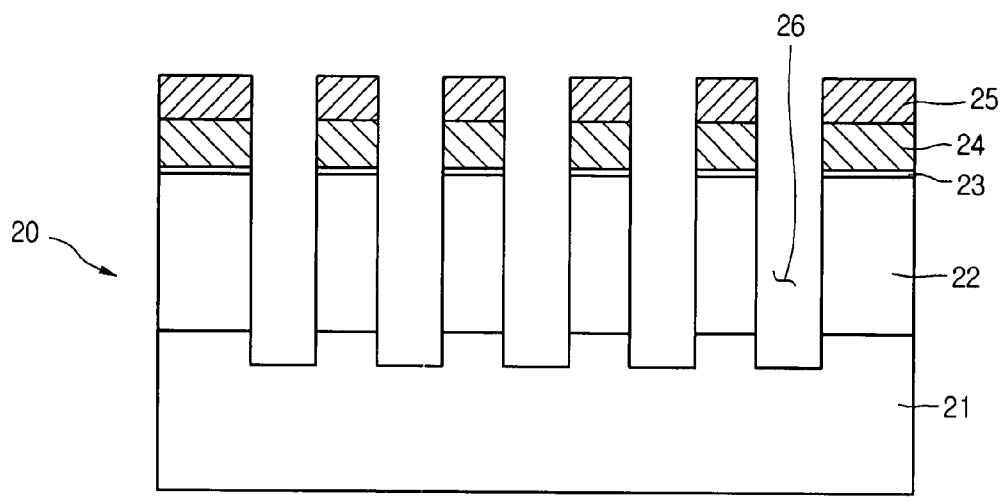

As illustrated in FIG. 3, the nitride layer 24, the first oxide layer 23, the silicon layer 22 and a portion of the epitaxial layer 21 in the semiconductor substrate 20 are etched using the first photoresist pattern 25 as a mask, thereby forming a plurality of trenches 26. At this time, although the plurality of trenches 26 are formed using the first photoresist pattern 25 as a mask in this embodiment, the trenches 26 may be formed using a hard mask such as a nitride layer (e.g., the nitride layer pattern formed by etching the nitride layer 24). Here, the trenches 26 may include via holes.

Figure 4:
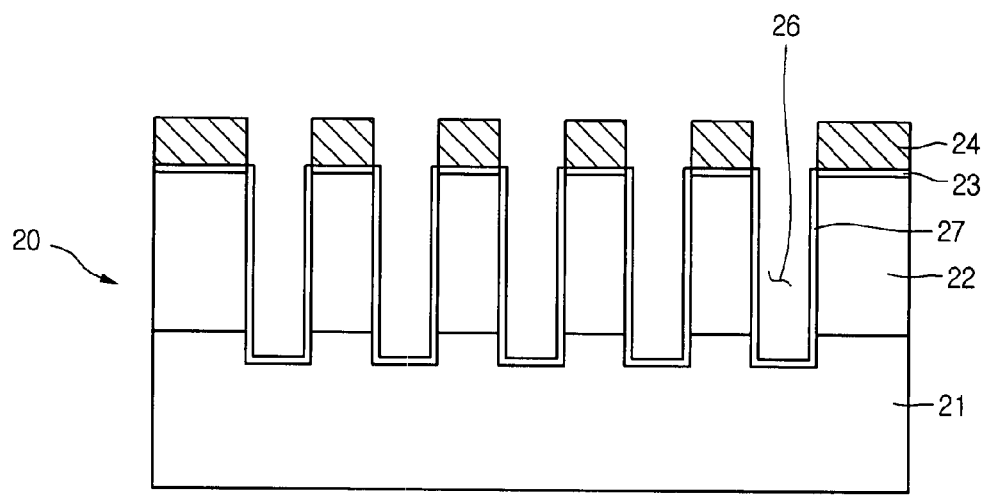

As illustrated in FIG. 4, the first photoresist pattern 25 is removed, and a second oxide layer 27 that serves as an insulating layer is formed in the trenches 26 through an oxidation process such as thermal oxidation. That is, the second oxide layer 27 is formed on surfaces of the exposed silicon layer 22 and epitaxial layer 21.

Figure 5:
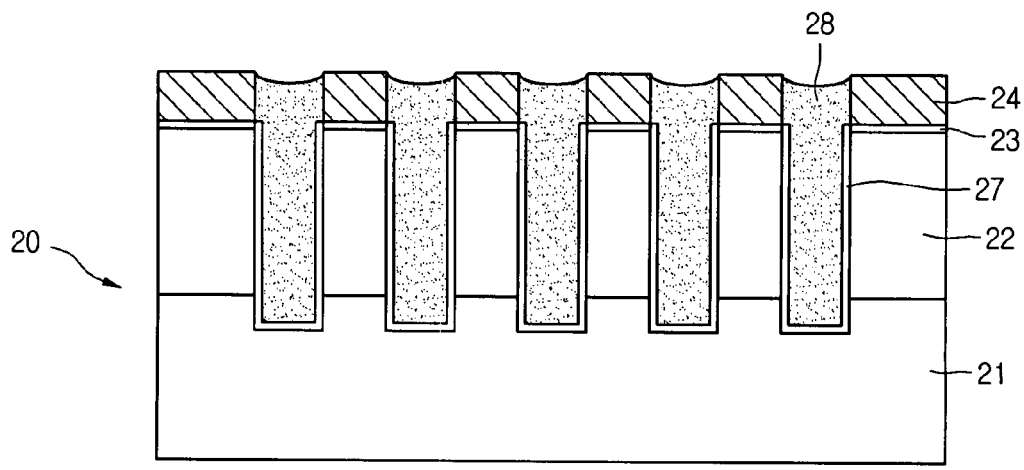

As illustrated in FIG. 5, polysilicon is coated or deposited in the trenches having the second oxide layer 27. The polysilicon deposited on the nitride layer 24 is removed by chemical mechanical polishing (CMP) using the nitride layer 24 as an etch stop layer, thereby forming floating gates 28. Here, the floating gate 28 comprises or is formed of a conductive material. Polysilicon, aluminum (Al) or tungsten (W) having superior gap-fill characteristics and conductivity may be used as the floating gate 28.

At this time, there may occur a dishing effect that the polysilicon in a central portion in the trench 26 is removed to a greater extent than that at a portion adjacent to the nitride layer 24 due to a difference in polish/etch selectivity between the nitride layer 24 and the polysilicon. Thus, side portions of the floating gate 28 (i.e., adjacent to the nitride layer 24) may have the shape of protruded tips. In the present invention, the greater the dishing (i.e., the more protruded the tips), the greater the enhancement for improving the tunneling efficiency of erase operations performed on the floating gate(s) 28.

Figure 6:
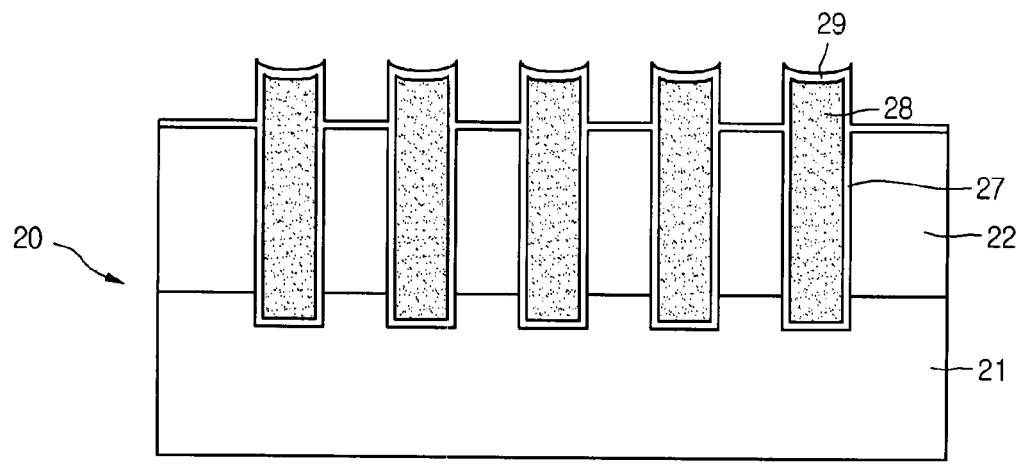

As illustrated in FIG. 6, the nitride layer 24 is removed, generally by etching (e.g., wet etching using aqueous $H_3PO_4$), and a third oxide layer 29 is formed on the entire surface of the semiconductor substrate 20 through an oxidation process such as thermal oxidation or by deposition of a conventional high-temperature (silicon) oxide. At this time, since the first oxide layer 23 has been formed on the silicon layer 22, the second oxide layer 27 is formed in the trench 26, and the third oxide layer 29 is formed on the top surface and side surfaces of the floating gate 28, the floating gate 28 can be completely surrounded or encompassed by oxide (or other insulator). Meanwhile, since a speed or rate at which the third oxide layer 29 grows on the floating gate 28 formed of polysilicon is faster than the rate at which the first oxide layer 23 grows during formation of the third oxide layer 29, an oxide layer having a uniform thickness can be formed on the entire surface of the semiconductor substrate 20.

The third oxide layer 29 on the floating gate 28 may be formed under process conditions that result in the thickness of the third oxide layer 29 being less than that of the first oxide layer 23 on the silicon layer 22.

Here, the third oxide layer 29 may be formed through a high temperature oxidation process. When forming the third oxide layer 29 through the high temperature oxidation process, an oxide layer is uniformly grown on the entire surface of the semiconductor substrate 20. When the process is conducted under conditions sufficient to grow further oxide from the silicon layer 22 under first oxide 23, the thickness of the third oxide layer 29 on the floating gate 28 is less than that of the first oxide layer 23 on the silicon layer 22.

However, hereinafter, the first and third oxide layers 23 and 29 will be referred to as the third oxide layer 29 for convenience of illustration.

Figure 7:
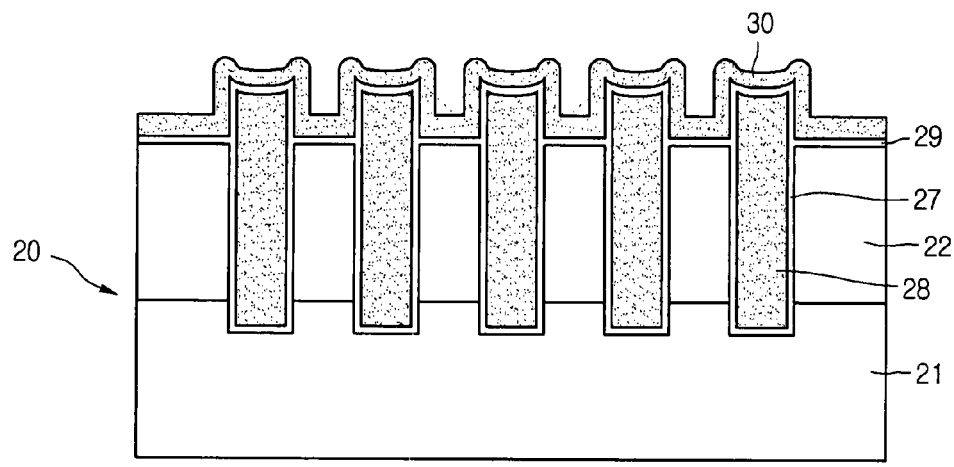

After that, a polysilicon layer 30 is formed (e.g., by CVD of an amorphous silicon layer, followed by thermal or UV light-induced crystallization) on the entire surface of the semiconductor substrate 20 as illustrated in FIG. 7. At this time, the thickness of the polysilicon layer 30 is selected such that polysilicon does not completely fill in the gap between adjacent floating gates 28.

Figure 8:
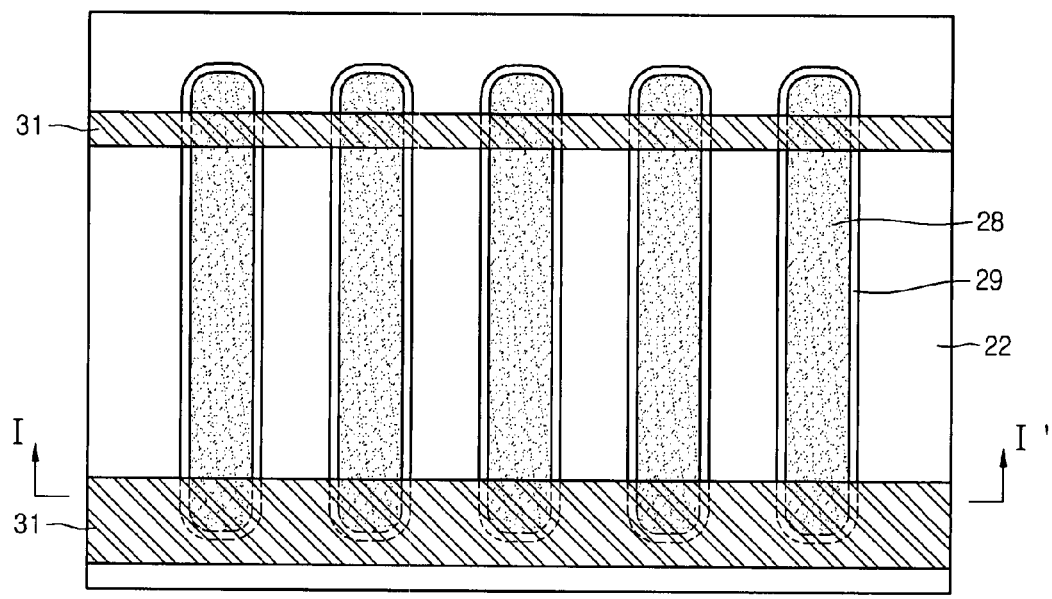
Figure 9:
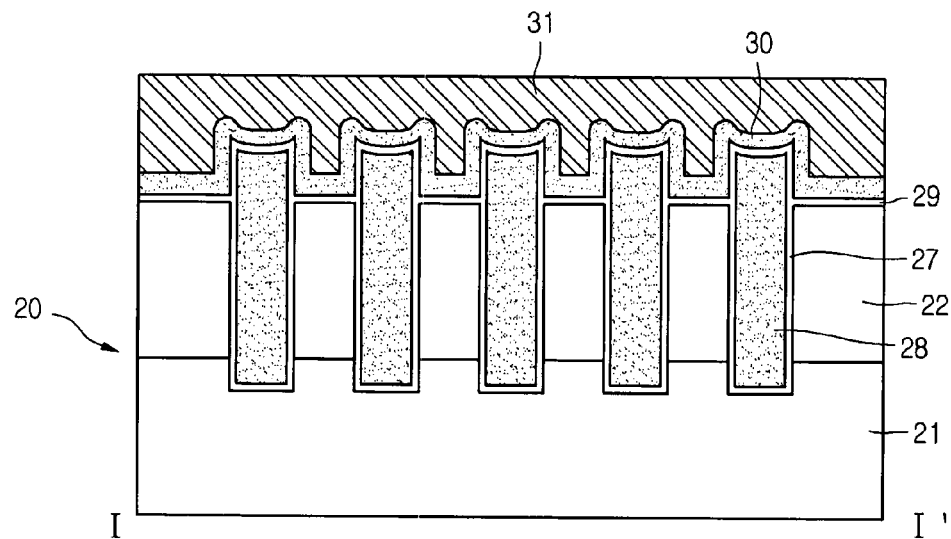

As illustrated in FIGS. 8 and 9, a photoresist is coated on the entire surface of the semiconductor substrate 20, thereby forming a second photoresist pattern 31. However, since the third oxide layer 29 and the poly-silicon layer 30 are on the entire surface of the semiconductor substrate 20 as illustrated in FIG. 7, FIG. 8 does not show the third oxide layer 29, or the polysilicon layer 30 for convenience of illustration. FIG. 9 illustrates a cross-sectional view taken along line I-I' in FIG. 8.

The exposed portions of the polysilicon layer 30 on the entire surface of the semiconductor substrate 20 are removed by conventional dry etching with one or more (hydro) fluorocarbon etchants, using the second photoresist pattern 31 illustrated in FIGS. 8 and 9 as a mask. The portions of polysilicon layer 30 that are not removed by dry etching will form a tunneling gate and a control gate. At this time, the area (or length) of the control gate at a lower portion of FIG. 8 is about three times greater than that of the tunneling gate at an upper portion of FIG. 8 to reduce or minimize interference in programming and/or erasing processes.

Figure 10:
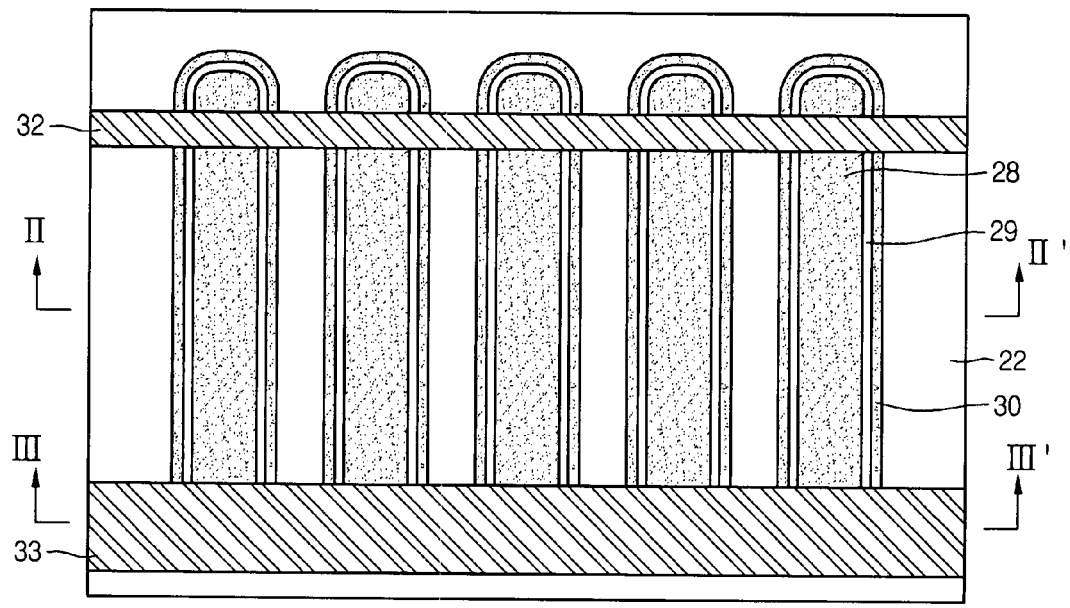
Figure 11:
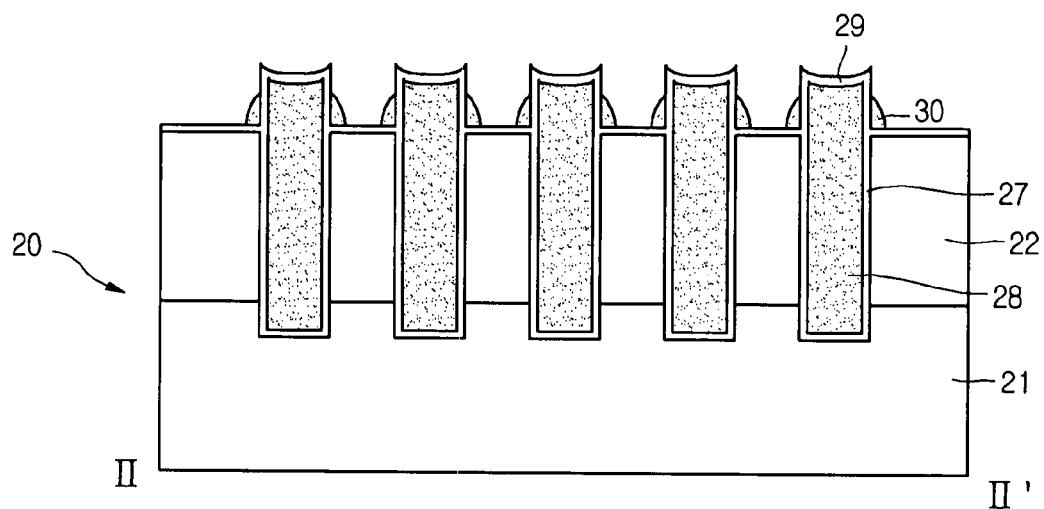
Figure 12:
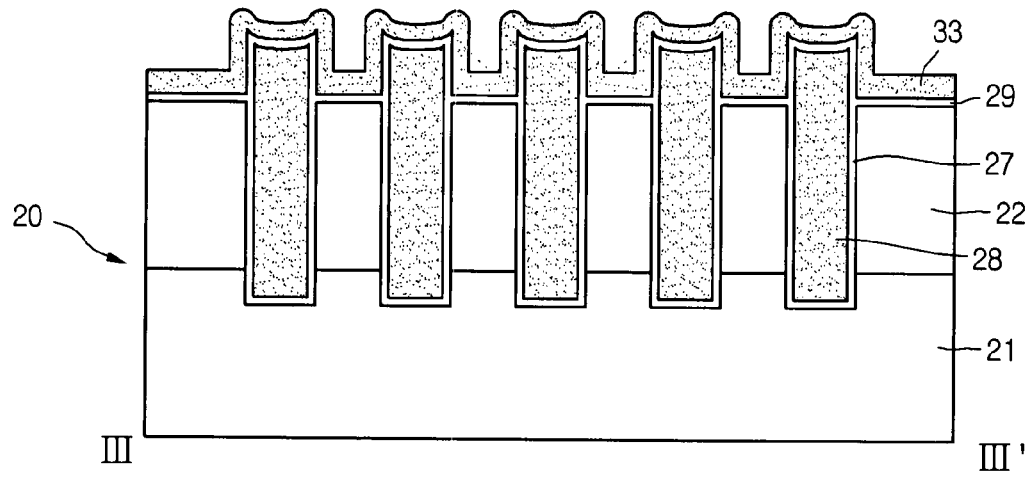

FIGS. 10 to 12 are views illustrating the removal of most exposed portions of the polysilicon layer 30 using the second photoresist pattern 31 as a mask. In FIG. 10, the third oxide layer 29 on the floating gate 28 is not shown for convenience of illustration. This will be more apparent with reference to FIGS. 11 and 12.

Referring to FIGS. 10 to 12, the exposed portions of polysilicon layer 30 are etched, and most of the exposed portions of polysilicon layer 30 are removed using the photoresist pattern 31 as a mask, thereby forming a tunneling gate 32 and a control gate 33, each of which intersects and/or overlaps the plurality of floating gates 28. Another portion of polysilicon layer 30 remains in a sidewall spacer shape along the sidewall of oxide layer 29. This structure is formed by a timed dry etch of the polysilicon layer 30, and after subsequent processing, forms tips for enhancing the efficiency of programming by tunneling.

Although the tunneling gate 32 and the control gate 33 are formed together (or simultaneously or concurrently) in this embodiment, the control gate 33 may not be formed. The control gate 33 functions to lower an operation voltage of the tunneling gate 32. The semiconductor device of this embodiment may be operated only with the tunneling gate 32.

FIG. 11 is a cross-sectional view taken along line II-II' in FIG. 10, in which a portion of the polysilicon layer 30 remains on sidewalls of the oxide layer 29 on floating gate 28. FIG. 12 is a cross-sectional view taken along line III-III' in FIG. 10, in which the control gate 33 is formed. Although not shown in these figures, the cross-sectional shape of the tunneling gate 32 is also identical with that of the control gate 33 of FIG. 12.

Figure 13:
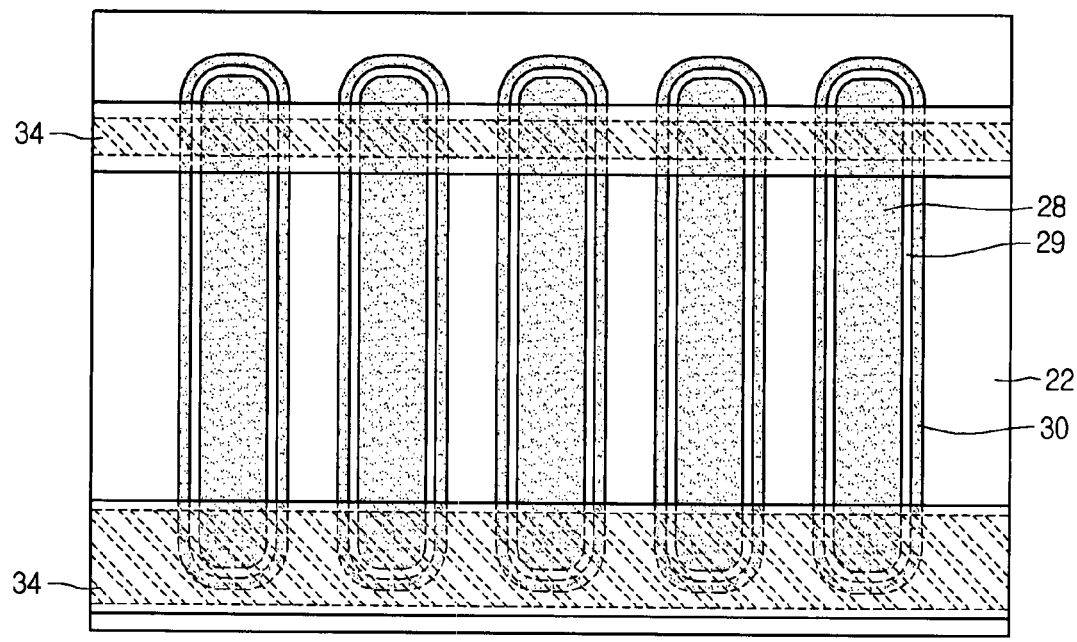

As illustrated in FIG. 13, a photoresist is coated on the entire surface of the semiconductor substrate 20, and the photoresist is patterned to remain on the tunneling gate 32 and the control gate 33, thereby forming third photoresist patterns 34. At this time, the third photoresist pattern 34 has a greater width than that of the tunneling gate 32 and, when present, a greater width than that of the control gate 33. In one embodiment, as shown in FIG. 13, the third photoresist pattern 34 completely covers the tunneling gate 32 and the control gate 33, plus a portion of the polysilicon layer 30 on each opposed side of the tunneling gate 32 and the control gate 33.

Figure 14:
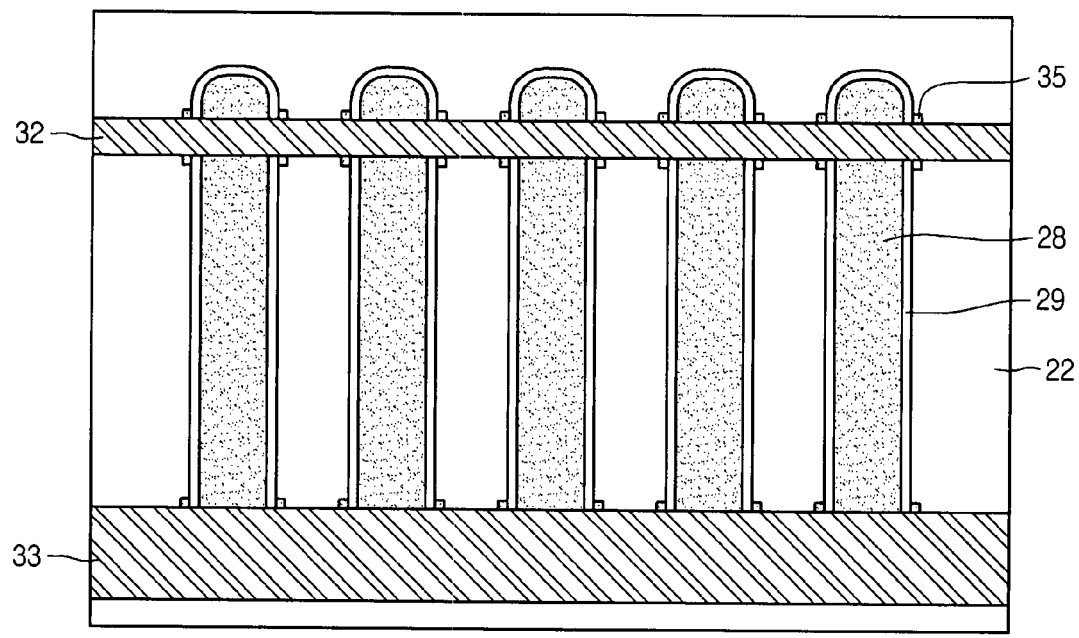

As illustrated in FIG. 14, the polysilicon layer 30 partially remaining on the sidewalls of the floating gate 28 is removed using the third photoresist pattern 34 as a mask, thereby preventing the tunneling gate 32 and the control gate 33 from being electrically connected by the polysilicon layer 30. Further, a portion of the polysilicon layer 30 is left on the sidewalls of the tunneling gate 32, thereby forming sidewall tips 35. Sidewall tips 35 effectively improve the tunneling efficiency of the programming operations. Further improvements on the tunneling efficiency of the sidewall tips 35 may be realized by converting polysilicon sidewall tips 35 to a metal silicide (e.g., depositing a silicide-forming metal such as titanium, tantalum, molybdenum, tungsten, cobalt, nickel, platinum, palladium, etc., then annealing to form a metal silicide, then removing unreacted metal by a selective etch). Such silicidation will also generally convert at least part of the tunneling gate 32 and the control gate 33 to a metal silicide as well.

Figure 15:
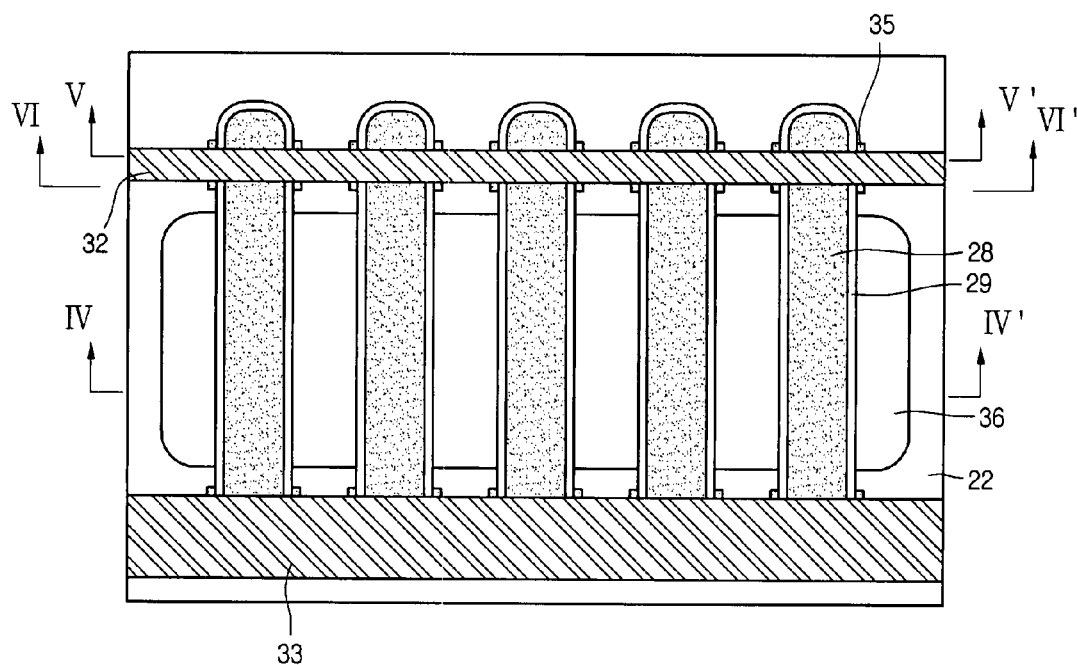

After that, as illustrated in FIG. 15, first conductive impurity ions are implanted into the silicon layer 22 on both (or opposed) sides of the floating gate 28, generally between the tunneling gate 32 and the control gate 33, thereby forming a source area 36.

Figure 16:
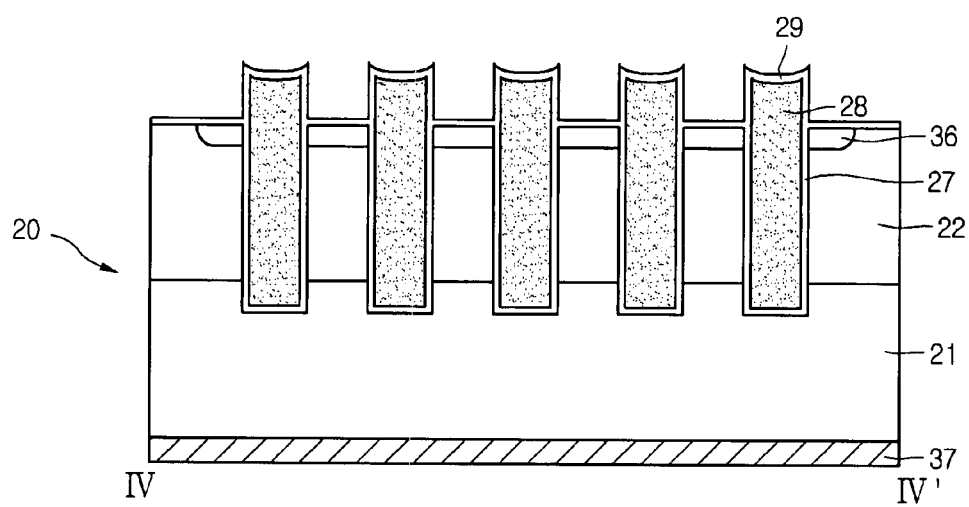

FIG. 16 is a cross-section view taken along line IV-IV' in FIG. 15. That is, as illustrated in FIG. 16, the source area 36 is formed on the surface of the silicon layer 22 through the implantation of the first conductive impurity ions.

Further, first conductive impurity ions are implanted onto the rear surface of the semiconductor substrate 20, i.e., the bottom surface of the semiconductor substrate 20, thereby forming a drain area 37. Here, the drain area 37 may be formed in the initial step of preparing the semiconductor substrate 20, and the particular time when the drain area 37 is formed is optional.

Figure 17:
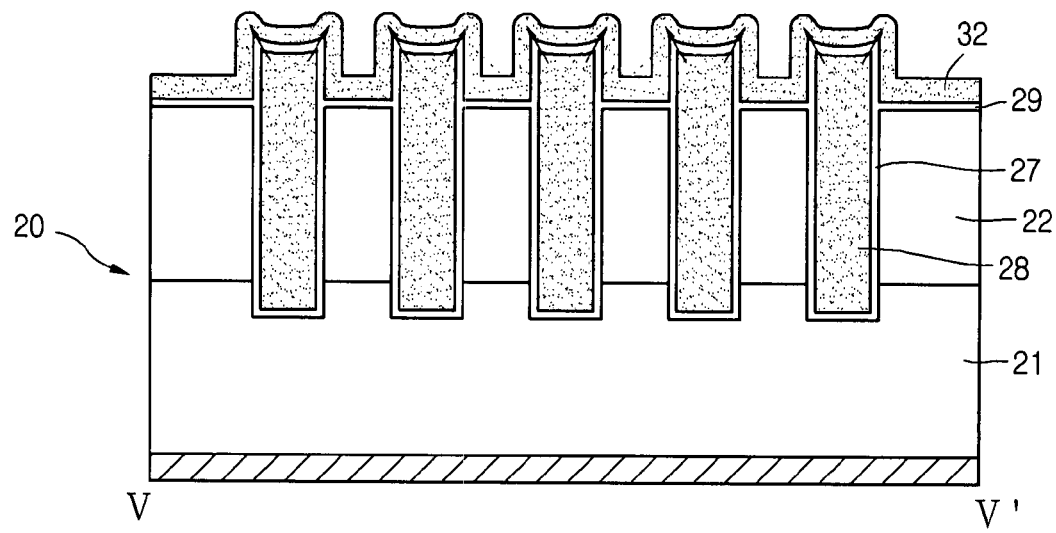
FIGS. 17 and 18 are cross-sectional views illustrating the operation of the semiconductor device according to an embodiment of the invention.
Figure 18:
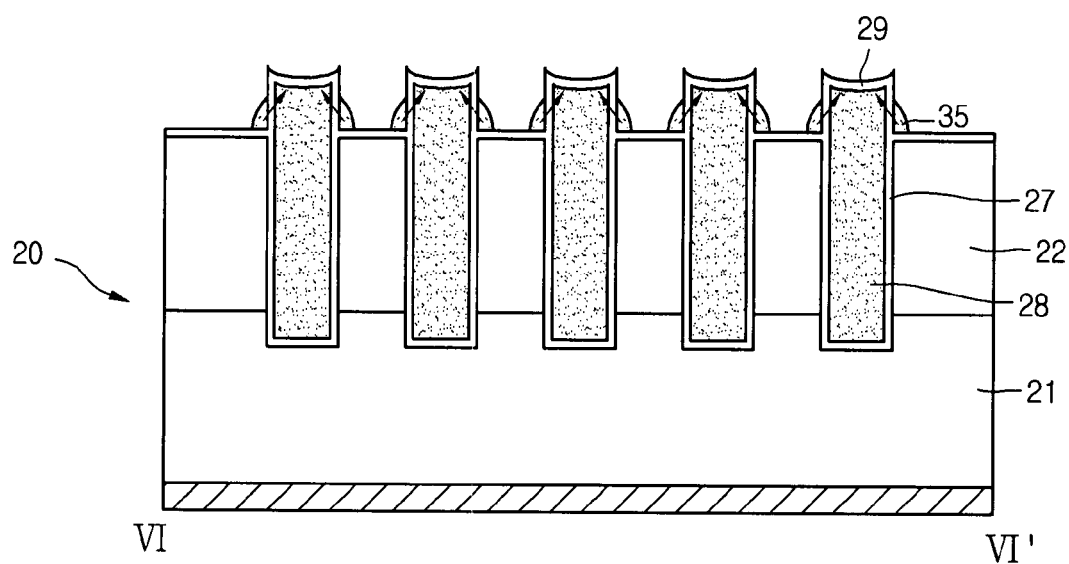
Figure 19:
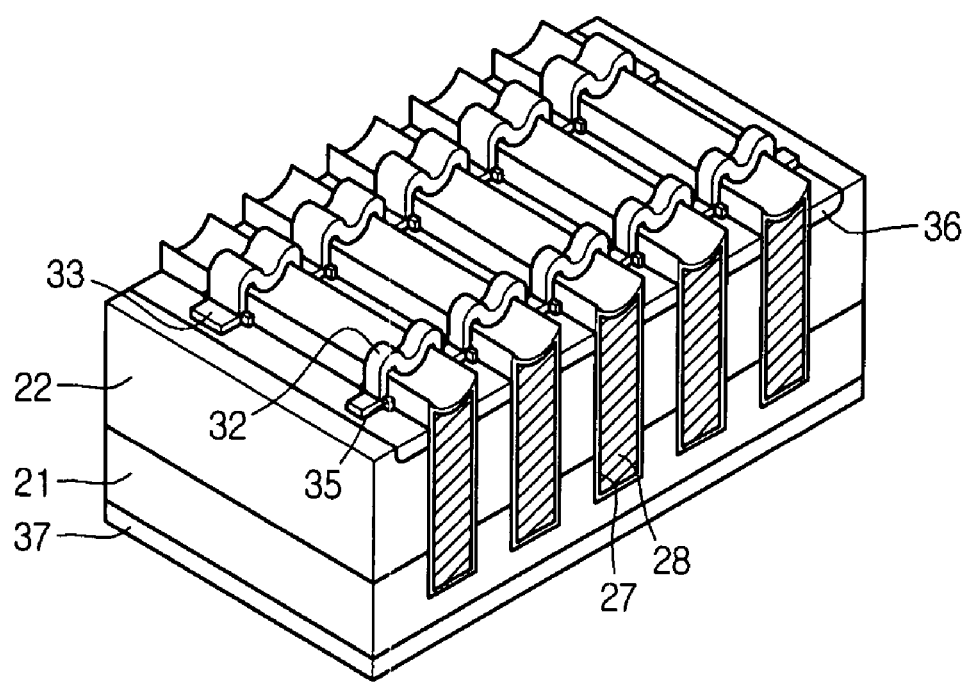
FIG. 19 is a perspective view of a semiconductor device according to an embodiment of the invention.

FIGS. 17 and 18 are cross-sectional views illustrating the operation of a semiconductor device according to various embodiments. FIG. 17 is a cross-sectional view taken along line V-V' in FIG. 15. FIG. 18 is a cross-sectional view taken along line VI-VI' in FIG. 15.

When applying a negative (−) voltage to the control gate 33 and applying a positive (+) voltage to the tunneling gate 32, field enhanced tunneling occurs at the protrusions on the floating gate 28, and thus electrons in the floating gate 28 are removed. For example, when applying a voltage of −10V to the control gate 33, applying a voltage of 10V to the tunneling gate 32 and applying a voltage of 0V to the source and drain areas 36 and 37, an erase operation may be performed in which electrons in the floating gate 28 move to the tunneling gate 32.

If the control gate 33 is not present, when applying a voltage of 20V to the tunneling gate 32 and applying a voltage of 0V to the source and drain areas 36 and 37, an erase operation may be performed in which electrons in the floating gate 28 move to the tunneling gate 32. Accordingly, a threshold voltage is reduced, and thus a current flows between the source and drain areas 36 and 37 when an appropriate electric potential is across the source and drain 36 and 37.

Further, when applying a positive (+) voltage to the control gate 33 and applying a negative (−) voltage to the tunneling gate 32, field enhanced tunneling occurs at the sidewall tips 35, and thus electrons in the sidewall tips 35 (and/or elsewhere in the tunneling gate 32 across the oxide layer 29 from floating gate 28) flow into the floating gate 28. For example, when applying a voltage of 10V to the control gate 33, applying a voltage of −10V to the tunneling gate 32, applying a voltage of 0V to the source area 36 and applying a voltage of 30V to the drain area 37, a program operation may be performed while electrons in the sidewalls 35 move to the floating gate 28.

If the control gate 33 is not formed, when applying a voltage of −20V to the tunneling gate 32, applying a voltage of 0V to the source area 36 and applying a voltage of 30V to the drain area, a program operation can be performed while electrons in the sidewall tips 35 and/or elsewhere in the tunneling gate 32 (e.g., in the region of tunneling gate 32 along oxide layer 29 between the sidewall tips 35) move to the floating gate 28. Accordingly, a threshold voltage increases as a result of the programming operation, and thus a current between the source and drain areas 36 and 37 can be cut off.

Meanwhile, when applying a voltage of 0V to the control gate 33, applying a voltage of 0V to the tunneling gate 32, applying a voltage of 0V to the source area 36 and applying a voltage of 30V to the drain area, a read operation (e.g., reading a stored state of the nonvolatile memory cell including floating gate 28) can be performed.

In a semiconductor device and a method of manufacturing the same according to the present disclosure, a power control state can be stored and power can be supplied in accordance with the power control state. That is, power can be supplied in accordance with a previous power control state without applying control power for controlling power supply.

Further, in a semiconductor device and a method of manufacturing the same according to the present disclosure, a flash memory and a power switch device can be implemented in one device. In one embodiment, a power device can be controlled remotely (e.g., through an external signal provided to the tunneling gate 32 via a program/erase pin on the power device), for example to turn the device on and off, or in a case where the nonvolatile device can be partially programmed, to provide a power control function over a predetermined power range.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
   a semiconductor substrate having a source area at a first exposed surface of the semiconductor substrate, a drain area at a second exposed surface of the semiconductor substrate opposite from the first exposed surface, and a vertical channel between the source and drain areas;
   a plurality of trenches in the semiconductor substrate, through the source area and the channel, and at least partially through the drain area;
   a floating gate in each of the plurality of trenches, overlapping the source and drain areas, configured to control a current flow between the source and drain areas in accordance with a programmed or erased state of the floating gate;
   an insulating layer on an outer surface of each of the floating gates;
   a tunneling gate directly on the insulating layer, intersecting and overlapping each of the plurality of floating gates, the tunneling gate adapted to program and/or erase the floating gates;
   a control gate intersecting and overlapping each of the plurality of the floating gates, spaced apart from and not overlapping with the tunneling gate.

2. The semiconductor device as claimed in claim 1, wherein the source and drain areas comprise first conductivity type impurity ions, and the semiconductor substrate further comprises a second conductivity type layer between the source and drain areas.

3. The semiconductor device as claimed in claim 1, wherein the source area is at opposite sides of the floating gates.

4. The semiconductor device as claimed in claim 1, wherein the floating gates extend upward from the source area above the trenches in the semiconductor substrate.

5. The semiconductor device as claimed in claim 1, wherein the insulating layer comprises an oxide layer.

6. The semiconductor device as claimed in claim 1, wherein the control gate is adapted to program or erase the floating gates depending on an application voltage, together with the tunneling gate.

7. The semiconductor device of claim 1, wherein the control gate functions to lower an operation voltage of the tunneling gate.

8. The semiconductor device of claim 1, wherein a width of the control gate is approximately three times greater than a width of the tunneling gate.

9. The semiconductor device of claim 1, further comprising sidewall tips on the semiconductor substrate at opposite sides of the tunneling gate, the sidewall tips comprising silicon and having a height less than a distance by which the floating gates extend beyond the first exposed surface of the semiconductor substrate.

10. A semiconductor device comprising:
    a semiconductor substrate having a first conductivity type drain area at a first exposed surface, a first conductivity type layer between the drain area and a second exposed surface of the semiconductor substrate opposite from the first exposed surface, a second conductivity type layer between the first conductivity type layer and the second exposed surface, and a first conductivity type source area at the second exposed surface of the semiconductor substrate;
    a plurality of trenches through the source area, the second conductivity type layer, and the first conductivity type layer;
    a floating gate in each of the plurality of trenches, the floating gates extending beyond the second exposed surface;
    an insulating layer on an outer surface of the floating gates;
    a tunneling gate intersecting and overlapping each of the floating gates;
    a control gate intersecting and overlapping each of the floating gates, spaced apart from and not overlapping with the tunneling gate; and
    sidewall tips on or over the semiconductor substrate, at intersections of the tunneling gate and each floating gate, configured to move or pass electrons to the floating gates under conditions for programming the floating gates, the sidewall tips comprising silicon and having a height less than a height by which the floating gates extend beyond the second exposed surface.

11. The semiconductor device as claimed in claim 10, wherein the insulating layer includes an oxide layer.

12. The semiconductor device as claimed in claim 10, wherein when the floating gates are in a programmed state, a current between the source and drain areas is off, and when the floating gates are in an erased state, a current between the source and drain areas is on.

13. The semiconductor device as claimed in claim 10, wherein the control gate and tunneling gate are configured such that applying a predetermined negative voltage on the control gate and applying a predetermined positive voltage on the tunneling gate moves electrons in the floating gates to the tunneling gate.

14. The semiconductor device as claimed in claim 10, wherein the device is configured such that applying a predetermined positive voltage on the control gate and the drain area, and applying a predetermined negative voltage on the tunneling gate, moves electrons in the sidewall tips to the floating gates.

15. The semiconductor device as claimed in claim 10, wherein the first conductivity type layer comprises a first conductivity type epitaxial layer on the first conductivity type drain area.

16. The semiconductor device of claim 10, wherein a width of the control gate is approximately three times greater than a width of the tunneling gate.

17. A method of manufacturing a semiconductor device, the method comprising the steps of:

forming a plurality of trenches in a semiconductor substrate, the semiconductor substrate having a second conductivity type silicon layer, and the trenches extending through the second conductivity type silicon layer;

forming a plurality of floating gates in the trenches in the semiconductor substrate and extending above the semiconductor substrate;

forming an oxide layer on an entire surface of the semiconductor substrate, including an outer surface of the floating gates;

forming a polysilicon layer on an entire surface of the semiconductor substrate;

forming a first photoresist pattern on or over the semiconductor substrate;

selectively etching the polysilicon layer, thereby forming (i) a tunneling gate and a control gate directly on the oxide layer, intersecting and overlapping each of the floating gates, the tunneling gate and control gate being spaced apart from each other and not overlapping with each other, and (ii) sidewall spacers along sidewalls of each of the floating gates, at opposite sides of the tunneling gate;

selectively etching the sidewall spacers, thereby forming sidewall tips at opposite sides of the tunneling gate, the sidewall tips having a height less than a distance by which the floating gates extend beyond the semiconductor substrate; and implanting first conductivity type impurity ions into a first exposed surface of the semiconductor substrate, thereby forming a source area, and into a second exposed surface of the semiconductor substrate opposite from the first exposed surface, thereby forming a drain area.

18. The method as claimed in claim 17, wherein the step of forming the floating gates comprises the sub-steps of:

forming a pad oxide layer and a nitride layer on the entire surface of the semiconductor substrate;

forming a second photoresist pattern on the semiconductor substrate, and selectively etching the pad oxide layer, the nitride layer and the semiconductor substrate, thereby forming a trench;

forming a trench oxide layer in the trench;

depositing polysilicon on the entire surface of the semiconductor substrate;

removing the polysilicon outside the trench by CMP using the nitride layer as an etch stop layer, thereby forming the floating gates; and removing the nitride layer.

19. The method of claim 17, wherein the control gate functions to lower an operation voltage of the tunneling gate.

* * * * *